United States Patent
Blanc et al.

(10) Patent No.: US 10,355,649 B2
(45) Date of Patent: Jul. 16, 2019

(54) VOLTAGE/CURRENT GENERATOR HAVING A CONFIGURABLE TEMPERATURE COEFFICIENT

(71) Applicant: STMicroelectronics SA, Montrouge (FR)

(72) Inventors: Jean-Pierre Blanc, Theys (FR); Severin Trochut, Gilly sur Isere (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/683,236

(22) Filed: Aug. 22, 2017

(65) Prior Publication Data
US 2018/0254753 A1    Sep. 6, 2018

(30) Foreign Application Priority Data
Mar. 3, 2017    (FR) ...................................... 17 51747

(51) Int. Cl.
| | | |
|---|---|---|
| *H03F 3/04* | (2006.01) | |
| *H03F 1/30* | (2006.01) | |
| *H03F 1/02* | (2006.01) | |
| *G05F 3/30* | (2006.01) | |

(52) U.S. Cl.
CPC ............... *H03F 1/302* (2013.01); *G05F 3/30* (2013.01); *H03F 1/0205* (2013.01); *H03F 3/04* (2013.01); *H03F 2200/447* (2013.01)

(58) Field of Classification Search
CPC . H03F 3/04; H03F 2200/468; H03F 2200/528

USPC .................................. 330/256, 289; 327/513
See application file for complete search history.

(56) References Cited

U.S. PATENT DOCUMENTS

| | | | | |
|---|---|---|---|---|
| 4,524,318 A | * | 6/1985 | Burnham | G05F 3/30 323/313 |
| 4,727,269 A | * | 2/1988 | Luich | G11C 7/067 323/316 |
| 5,068,595 A | | 11/1991 | Kearney et al. | |
| 6,340,882 B1 | | 1/2002 | Chung et al. | |
| 7,323,857 B2 | | 1/2008 | Sung | |
| 9,385,689 B1 | | 7/2016 | Thakur et al. | |
| 2006/0097790 A1 | * | 5/2006 | Bokatius | H03F 1/30 330/289 |
| 2009/0066313 A1 | | 3/2009 | Kimura | |
| 2009/0146727 A1 | * | 6/2009 | Huang | G05F 3/30 327/513 |
| 2016/0327972 A1 | | 11/2016 | Ippolito et al. | |
| 2017/0227975 A1 | * | 8/2017 | Chu | G05F 3/30 |

FOREIGN PATENT DOCUMENTS

EP    0 443 239 A1    8/1991

\* cited by examiner

*Primary Examiner* — Steven J Mottola
(74) *Attorney, Agent, or Firm* — Seed IP Law Group LLP

(57) ABSTRACT

A voltage or current generator has a configurable temperature coefficient and includes a first voltage generator that generates a first voltage having a first negative temperature coefficient. A second voltage generator generates a second voltage having a second negative temperature coefficient different to the first negative temperature coefficient. A circuit generates an output level based on the difference between the first voltage scaled by a first scale factor and the second voltage scaled by a second scale factor.

15 Claims, 2 Drawing Sheets

VOLTAGE/CURRENT GENERATOR HAVING A CONFIGURABLE TEMPERATURE COEFFICIENT

BACKGROUND

Technical Field

The present disclosure relates to the field of voltage and current generators, and in particular to a voltage/current generator having a configurable temperature coefficient.

Description of the Related Art

It is known to provide voltage and current generators having a configurable temperature coefficient. For example, such generators are used in applications in which it is desired to counteract variations resulting from changes in temperature. For example, such a generator may be used to generate a voltage or current bias in order to control the transconductance of one or more transistors of an amplifier, for example with the objective of improving linearity of the amplifier as a function of temperature.

However, a drawback of existing voltage and current generators having configurable temperature coefficients is that they generally require a relatively complex implementation, leading to a circuit that occupies a relatively large area and has a relatively high power consumption. Furthermore, the range of temperature coefficients that can be achieved in such a circuit tends to be limited.

There is thus a need in the art for a voltage/current generator capable of having a relatively simple and compact implementation with a low power consumption, and that is capable of being configured to have one of a relatively wide range of temperature coefficients.

BRIEF SUMMARY

It is an aim of embodiments of the present disclosure to at least partially address one or more needs in the prior art.

According to one aspect, there is provided a voltage or current generator having a configurable temperature coefficient, comprising: a first voltage generator adapted to generate a first voltage having a first negative temperature coefficient; a second voltage generator adapted to generate a second voltage having a second negative temperature coefficient different to the first negative temperature coefficient; and a circuit adapted to generate an output level based on the difference between the first voltage scaled by a first scale factor ($\alpha$) and the second voltage scaled by a second scale factor ($\beta$).

According to an embodiment, the first voltage generator is a first bipolar junction transistor and the first voltage is the base-emitter voltage of the first bipolar junction transistor; and the second voltage generator is a second bipolar junction transistor and the second voltage is the base-emitter voltage of the second bipolar junction transistor.

According to an embodiment, the first and second bipolar junction transistors are of difference sizes to each other.

According to an embodiment, the voltage or current generator further comprises a first resistor coupled between the base and the emitter of the first bipolar junction transistor; a second resistor coupled between the base and the emitter of the second bipolar junction transistor; a third resistor coupled between the emitter of the second bipolar junction transistor and a reference voltage rail, wherein the base of the first bipolar junction transistor is coupled to the base of the second bipolar junction transistor and to a collector of the first bipolar junction transistor via a buffer; and a current mirror, adapted to mirror the collector current of the first and second bipolar junction transistors in order to generate the output level.

According to an embodiment, the voltage or current generator further comprises a further resistor coupled between the bases of the first and second bipolar junction transistors.

According to an embodiment, the buffer is formed by a transistor having its control node coupled to the collector of the first bipolar junction transistor, and one of its main conducting nodes coupled to the base of the second bipolar junction transistor.

According to an embodiment, the voltage or current generator further comprises a fourth resistor coupled between the emitter of the first bipolar junction transistor and the reference voltage rail.

According to an embodiment, the current mirror comprises: a first transistor coupled by its main conducting nodes between the collector of the first bipolar transistor and a supply voltage rail; a second transistor coupled by its main conducting nodes between the collector of the second bipolar transistor and the supply voltage rail, the second transistor forming a reference branch of the current mirror; and a third transistor coupled by its main conducting nodes between an output node of the generator and the supply voltage rail.

According to an embodiment, the first bipolar junction transistor comprises a parallel connection of one or more first devices, and the second bipolar junction transistor comprises a parallel connection of one or more second devices, wherein the number of first devices is different to the number of second devices.

According to one aspect, there is provided an amplifier comprising a biasing input for receiving a biasing current or voltage; and the above generator adapted to generate said biasing current or voltage.

BRIEF DESCRIPTION OF THE SEVERAL VIEWS OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the present disclosure, the term "connected" is used to designate a direct electrical connection between components or nodes, whereas the term "coupled" is used to designate a connection between the components or nodes that may be direct, or may be via one or more intermediate components, such as capacitors, resistors or transistors.

Furthermore, the expression "generator having a configurable temperature coefficient" is used to designate a generator in which the temperature coefficient is at a fixed value that is a function of one or more fixed component values, as well as a generator in which the temperature coefficient is adjustable after fabrication as a function of one or more variable component values.

Figure 1:
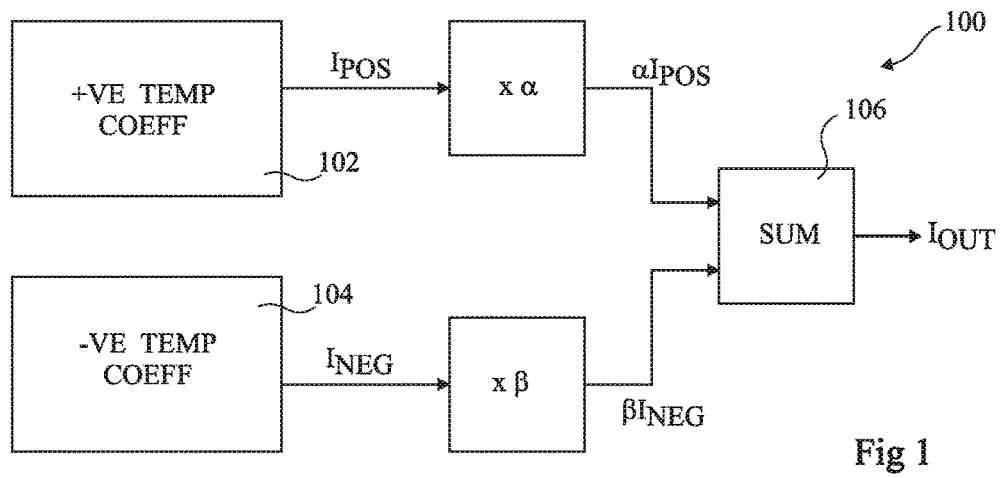
FIG. 1 schematically illustrates a current generator having a configurable temperature coefficient according to an approach that has been proposed.

FIG. 1 schematically illustrates a current generator 100 having a configurable temperature coefficient according to an example approach that has been proposed. The current generator 100 comprises a current generator (+VE TEMP COEFF) 102 having a positive temperature coefficient, and a current generator (−VE TEMP COEFF) 104 having a negative temperature coefficient. The output current $I_{POS}$ of the generator 102 is for example multiplied by a scale factor $\alpha$ to generate a value $\alpha I_{POS}$. Similarly, the output current $I_{NEG}$ of the generator 104 is for example multiplied by a scale factor $\beta$ to generate a value $\beta I_{NEG}$. The values $\alpha I_{POS}$ and $\beta I_{NEG}$ are added by a circuit 106 (SUM) to generate an output current $I_{OUT}$.

The temperature coefficient of the output current $I_{OUT}$ is a function of the scale factors $\alpha$ and $\beta$, and thus the choice of these scale factors permits the temperature coefficient to be adjusted.

A drawback of a current generator of the type of FIG. 1 is that it requires a relatively complex implementation, leading to relatively high surface area and power consumption. For example, a current generator of this type is described in more detail in the US patent published as U.S. Pat. No. 7,323,857, in which an operational amplifier is used to implement the current generator having a negative temperature coefficient.

Furthermore, the range of temperature coefficients that can be obtained is somewhat limited. One technique for improving this range to some extent would be to inverse the sign of one of the currents $I_{POS}$ and $I_{NEG}$, in order to generate an output current of the form $I_{OUT}=\alpha I_{POS}-\beta I_{NEG}$. However, the solution remains complex to implement.

Figure 2:
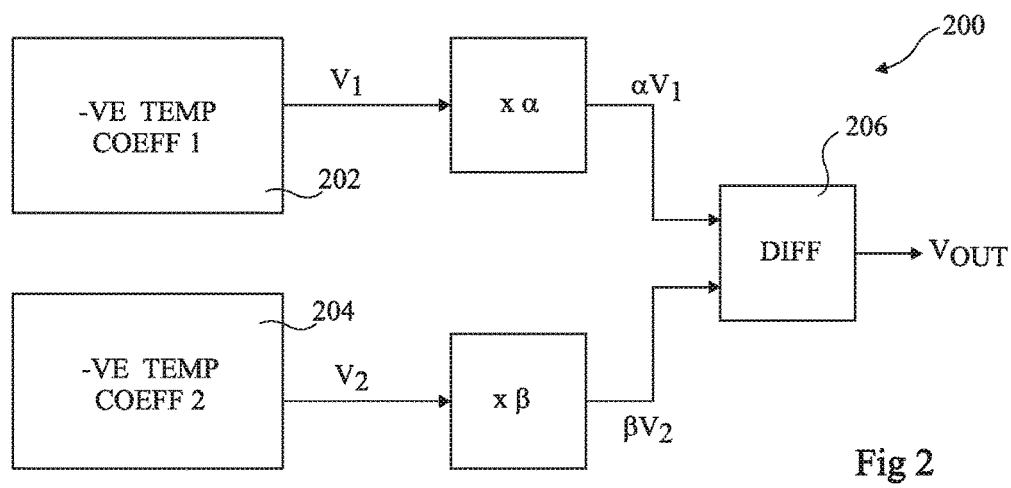
FIG. 2 schematically illustrates a voltage/current generator having a configurable temperature coefficient according to an example embodiment of the present disclosure.

FIG. 2 schematically illustrates a voltage/current generator 200 having a configurable temperature coefficient according to an example embodiment of the present disclosure.

The generator 200 of FIG. 2 for example comprises a pair of voltage generators 202, 204 each of which for example has a negative temperature coefficient. The temperature coefficients of these generators 202, 204 are different from each other. An output voltage $V_1$ of the generator 202 is multiplied by a scale factor $\alpha$ to provide a voltage level $\alpha V_1$, and similarly an output voltage $V_2$ of the generator 204 is multiplied by a scale factor $\beta$ to provide a voltage level $\beta V_2$. A circuit 206 receives the voltages $\alpha V_1$ and $\beta V_2$ and generates an output voltage level $V_{OUT}$ based for example on the difference between these voltages. For example, the output voltage level respects the relation $V_{OUT}=\alpha V_1-\beta V_2$.

By adjusting the coefficients $\alpha$ and $\beta$, the temperature coefficient of the generator 200 can be adjusted to a desired level. Furthermore, it is possible to generate an output voltage level having either a positive or a negative temperature coefficient.

While in FIG. 2 an example is illustrated in which the output is a voltage level, in alternative embodiments, the generator could generate a current level $I_{OUT}$.

Figure 3:
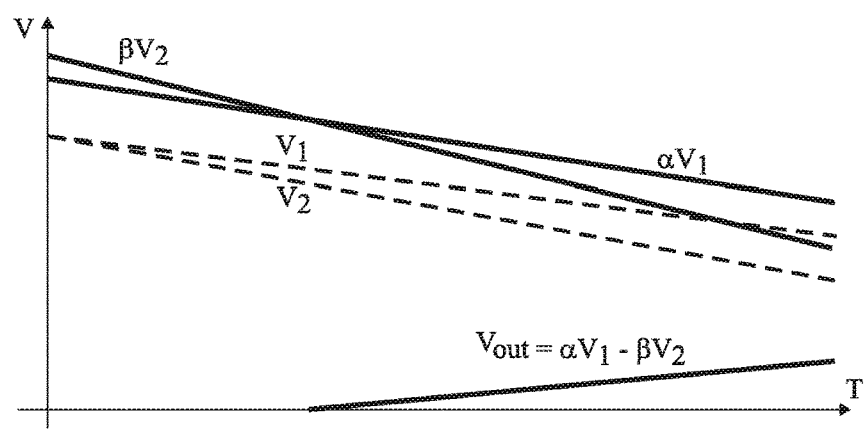
FIG. 3 is a graph representing an example of voltages in the circuit of FIG. 2 according to an example embodiment.

FIG. 3 is a graph illustrating examples of the voltages $V_1$ and $V_2$, the voltages $\alpha V_1$ and $\beta V_2$, and the output voltage level $V_{OUT}$ of the generator of FIG. 2. In this example, the gradient of the voltage $\beta V_2$ is greater than that of the voltage $\alpha V_1$, and thus the resulting temperature coefficient is positive. If the opposite were true, the temperature coefficient would be negative.

Figure 4:
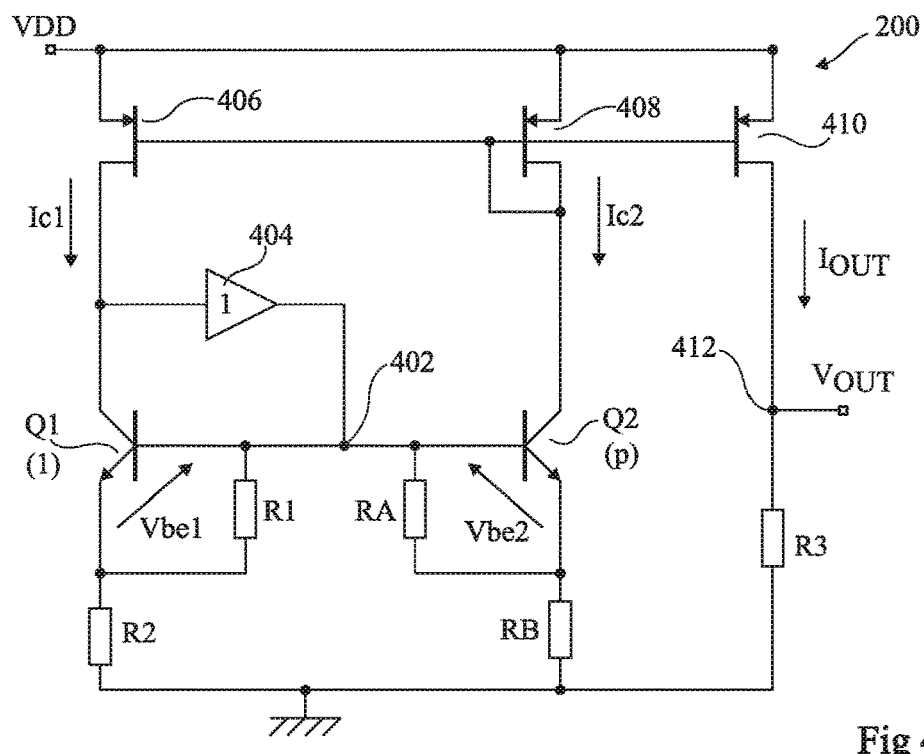
FIG. 4 is a circuit diagram illustrating an implementation of the voltage/current generator of FIG. 2 according to an example embodiment.

FIG. 4 is a circuit diagram illustrating an example implementation of the voltage/current generator 200 of FIG. 2. The generator is for example implemented by a circuit comprising bipolar junction transistors (BJTs) Q1 and Q2 of different sizes. For example, whereas the transistor Q1 comprises a single device, the transistor Q2 for example comprises p devices arranged in parallel with each other, where p is for example an integer equal to 2 or more. More generally, the number of devices implementing the transistor Q1 is for example different from the number of devices implementing the transistor Q2.

Each transistor Q1, Q2 for example has its base coupled to a common node 402. Furthermore, a resistor R1 is for example coupled between the base and the emitter of the transistor Q1, and a resistor R2 is for example coupled between the emitter of transistor Q1 and a ground reference rail. Similarly, a resistor RA is for example coupled between the base of the transistor Q2 and its emitter, and a resistor RB is for example coupled between the emitter of transistor Q2 and the ground reference rail.

The base currents of the transistors Q1 and Q2 are for example supplied by a buffer 404, which for example has unity gain and has its input coupled to the collector of the transistor Q1.

The generator 200 further comprises a current mirror having three branches respectively comprising PMOS transistors 406, 408 and 410 having their gates coupled together.

The transistor 408 for example forms a reference branch of the current mirror, and has its gate coupled to its drain, and its source coupled to a VDD supply rail. The drain of the transistor 408 is for example coupled to the collector of the transistor Q2, such that the reference branch conducts the collector current Ic2 of the transistor Q2.

The transistor 406 for example has its source coupled to the VDD supply rail, and its drain coupled to the collector of the transistor Q1, such that the collector current Ic1 of the transistor Q1 mirrors the collector current Ic2 of the transistor Q2. In some embodiments, the transistors 406 and 408 are of equal size, implying that the currents Ic1 and Ic2 are the same. Alternatively, the transistors 406 and 408 may be of different sizes, implying a fixed ratio between the currents Ic1 and Ic2.

The transistor 410 for example forms an output branch of the current mirror. The transistor 410 for example has its source coupled to the VDD supply rail, and its drain coupled to an output node 412 of the generator 200. The transistor 410 thus conducts the output current $I_{OUT}$ of the generator 200. In some embodiments, the node 412 is coupled to the ground reference rail via a resistor R3 such that the output current $I_{OUT}$ is converted into an output voltage $V_{OUT}$. However, in alternative embodiments, the generator 200 could be a current generator with the output current $I_{OUT}$ providing the output of the generator.

In operation, the transistors Q1 and Q2 respectively generate base-emitter voltages Vbe1 and Vbe2 that naturally have negative temperature coefficients. However, given the difference in size between the transistors Q1 and Q2, the temperature coefficients of the voltages Vbe1 and Vbe2 are different. The values of the resistors R1, R2, RA and RB for example set the values of the scale factors $\alpha$ and $\beta$, where $\alpha$ is for example equal to $(1+RB/R1)/(RB-R2)$ and $\beta$ is for example equal to $(1+RB/RA)/(RB-R2)$. Furthermore, as a result of the current mirror, the level of the currents Ic1, Ic2 and $I_{OUT}$ is a function of the difference between αVbe1 and βVbe2. For example, the current $I_{OUT}$ can be shown to respect the following relation:

$$I_{OUT} = \frac{Vbe1\left(1 + \frac{RB}{R1}\right) - Vbe2\left(1 + \frac{RB}{RA}\right)}{RB - R2}$$

and the output voltage $V_{OUT}$ can be shown to respect the following relation:

$$V_{OUT} = \frac{R3}{RB - R2}\left(Vbe1\left(1 + \frac{R2}{R1}\right) - Vbe2\left(1 + \frac{RB}{RA}\right)\right)$$

In some embodiments, the resistors R1, R2, RA and RB are fixed resistors having resistance values configured, along with the respective sizes of the transistors Q1 and Q2, to provide a desired temperature coefficient for a given application. In alternative embodiments, one or more of these resistors R1, R2, RA and RB could be a variable resistor allowing the temperature coefficient of the generator to be tuned after fabrication.

Figure 5:
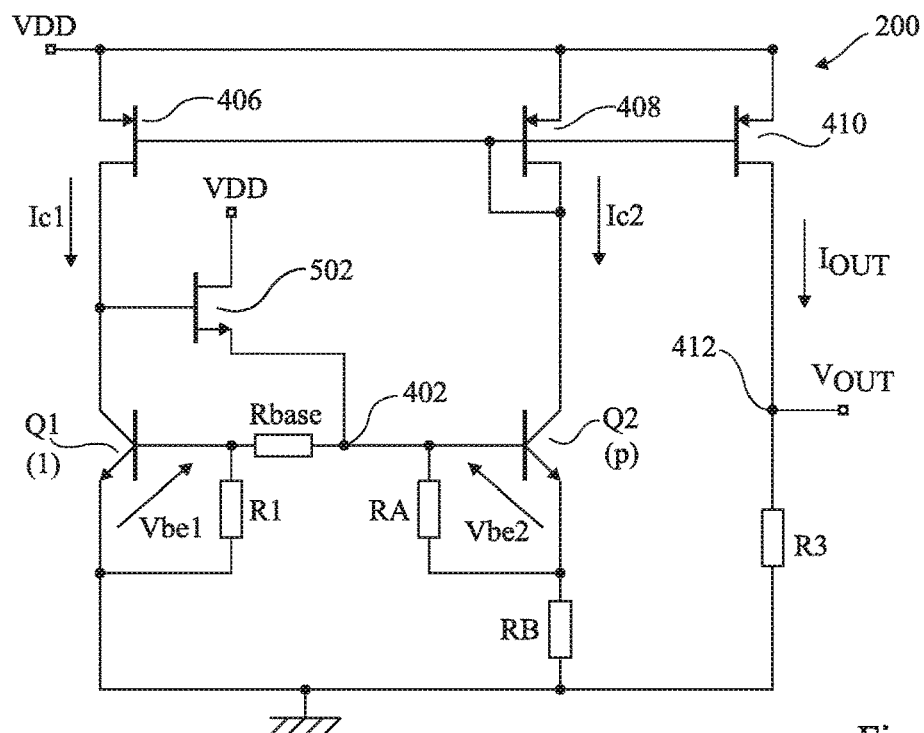
FIG. 5 is a circuit diagram illustrating an implementation of the voltage/current generator of FIG. 2 according to an alternative example embodiment.

FIG. 5 is a circuit diagram illustrating the generator 200 according to an alternative implementation to that of FIG. 4, and like features with respect to the circuit of FIG. 4 have been labelled with like reference numerals and will not be described again in detail.

In the embodiment of FIG. 5, the buffer 404 is implemented by an NMOS transistor 502 having its drain coupled to the VDD supply rail, its source coupled to the node 402, and its gate coupled to the collector of the transistor Q1. In the example of FIG. 5, the resistor R2 has been omitted, this term thus equaling zero in the above equations.

Furthermore, while the embodiment of FIG. 4 assumes that the base current is negligible, in some embodiments, the base current cannot be considered as entirely negligible. Thus in the circuit of FIG. 5, an extra resistor Rbase is provided between the node 402 and the base of the transistor Q1, thereby cancelling the effects of a non-negligible base current.

An advantage of the embodiments described herein is that the voltage/current generator is capable of being implemented using relatively few components, and thus occupies a relatively low circuit area and has relatively low power consumption. Furthermore, the temperature coefficient of the circuit can be varied over a relatively wide range, by suitably selecting the values of the scale factors α and β.

Having thus described at least one illustrative embodiment, various alterations, modifications and improvements will readily occur to those skilled in the art. For example, while particular circuit implementations have been illustrated in FIGS. 4 and 5, many variations to these circuit implementations would be possible. For example, the current mirror formed by PMOS transistors 406, 408 and 410 could be implemented by other types of transistors, such as bipolar junction transistors. Furthermore, while FIG. 5 provides one example of implementation of the buffer 404, other implementations would be possible.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage or current generator having a configurable temperature coefficient, comprising:
   a first bipolar junction transistor having a base, collector and emitter, a base-emitter voltage of the first bipolar junction transistor corresponding to a first voltage having a first negative temperature coefficient;
   a second bipolar transistor having a base, collector and emitter, a base-emitter voltage of the second bipolar junction transistor corresponding to a second voltage having a second negative temperature coefficient different than the first negative temperature coefficient, the second bipolar junction transistor having a different size than a size of the first bipolar junction transistor; and
   a circuit configured to generate an output based on a difference between the first voltage scaled by a first scale factor and the second voltage scaled by a second scale factor.

2. The voltage or current generator of claim 1, wherein the base of the first bipolar junction transistor is coupled to the base of the second bipolar junction transistor and wherein the voltage or current generator further comprises:
   a first resistor coupled between the base and the emitter of the first bipolar junction transistor;
   a second resistor coupled between the base and the emitter of the second bipolar junction transistor;
   a third resistor coupled between the emitter of the second bipolar junction transistor and a reference voltage rail;
   a buffer coupled between the collector of the first bipolar junction transistor and the base of first bipolar junction transistor; and
   a current mirror configured to mirror collector currents of the first and second bipolar junction transistors to generate the output.

3. The voltage or current generator of claim 2, further comprising a further resistor coupled between the bases of the first and second bipolar junction transistors.

4. The voltage or current generator of claim 2, wherein the buffer comprises a transistor having a control node coupled to the collector of the first bipolar junction transistor, and a conducting node coupled to the base of the second bipolar junction transistor.

5. The voltage or current generator of claim 4, further comprising a fourth resistor coupled between the emitter of the first bipolar junction transistor and the reference voltage rail.

6. The voltage or current generator of claim 2, wherein the current mirror comprises:
   a first transistor coupled between the collector of the first bipolar transistor and a supply voltage rail;
   a second transistor coupled between the collector of the second bipolar transistor and the supply voltage rail; and
   a third transistor coupled between an output node of the generator on which the output is generated and the supply voltage rail.

7. The voltage or current generator of claim 1, wherein the first bipolar junction transistor comprises a parallel connection of one or more first bipolar junction transistors, and the second bipolar junction transistor comprises a parallel connection of one or more second bipolar junction transistors, wherein a number of the first bipolar junction transistors is different than a number second bipolar junction transistors.

8. An amplifier comprising:
a biasing input that in operation receives a biasing signal; and
a generator that in operation generates the biasing signal, the generator including,
a first voltage generator that in operation generates a first voltage having a first negative temperature coefficient;
a second voltage generator that in operation generates a second voltage having a second negative temperature coefficient that is different than the first negative temperature coefficient;
an output circuit that in operation generates a first scaled voltage based on the first voltage and a second scaled voltage based on the second voltage, and that in operation generates the biasing signal based on a difference between the first scaled voltage and the second scaled voltage; and
wherein each of the first and second voltage generators includes one or more bipolar junction transistors and each of the first and second voltages corresponds to a base-emitter voltage of the one or more bipolar junction transistors, and wherein the one or more bipolar junction transistors of the first voltage generator have a first size and the one or more bipolar junction transistors of the second voltage generator have a second size different than the first size.

9. The amplifier of claim 8, wherein the output circuit in operation multiplies the first voltage by a first scale factor to generate the first scaled voltage and multiplies the second voltage by a second scale factor to generate the second scaled voltage.

10. The amplifier of claim 8, wherein the first voltage generator comprises one first bipolar junction transistor or a plurality of first bipolar junction transistors coupled in parallel, and the second generator comprises a plurality of second bipolar junction transistors coupled in parallel.

11. The amplifier of claim 10, wherein a number of the plurality of first bipolar junction transistors is different than a number of the second plurality of second bipolar junction transistors.

12. The amplifier of claim 8, wherein the biasing signal comprises a biasing current or a biasing voltage signal.

13. A method, comprising:
providing a first collector currents through a plurality of first bipolar junction transistors coupled in parallel to generate a first base-emitter voltage having a first negative temperature coefficient;
providing a second collector current through a second bipolar junction transistor to generate a second base-emitter voltage having a second negative temperature coefficient that is different than the first negative temperature coefficient;
adjusting the first base-emitter voltage by a first scaling factor to generate a scaled first base-emitter voltage;
adjusting the second base-emitter voltage by a second scaling factor to generate a scaled second base-emitter voltage; and
generating an output signal based on a difference of the scaled first base-emitter voltage and the scaled second base-emitter voltage.

14. The method of claim 13, wherein adjusting the first base-emitter voltage by the first scaling factor comprises multiplying the first base-emitter voltage by the first scaling factor and wherein adjusting the second base-emitter voltage by the second scaling factor comprises multiplying the second base-emitter voltage by the second scaling factor.

15. The method of claim 13, wherein generating the output signal comprises:
generating an output current based on the difference of the scaled first base-emitter voltage and the scaled second base-emitter voltage and
generating an output voltage based on the output current.

* * * * *